United States Patent [19]

Tanabe

[11] Patent Number: 5,105,214
[45] Date of Patent: Apr. 14, 1992

[54] IMAGE FORMING APPARATUS USING MASK ORIGINAL FORM

[75] Inventor: Kazunori Tanabe, Nagoya, Japan

[73] Assignee: Brother Kogyo Kabushiki Kaisha, Japan

[21] Appl. No.: 672,082

[22] Filed: Mar. 19, 1991

[30] Foreign Application Priority Data

Apr. 12, 1990 [JP] Japan ............... 2-39098[U]
May 1, 1990 [JP] Japan ............... 2-115531

[51] Int. Cl.$^5$ .................. G03B 27/32; G03B 27/52
[52] U.S. Cl. ........................... 355/32; 355/27; 355/75
[58] Field of Search .................. 355/32, 27, 75

[56] References Cited

U.S. PATENT DOCUMENTS

| | | |
|---|---|---|
| 4,810,614 | 3/1989 | Sangyoji et al. |
| 4,864,353 | 9/1989 | Okamoto ............... 355/27 |
| 4,875,074 | 10/1989 | Sangyoji et al. ............... 355/27 |
| 4,884,082 | 11/1989 | Sonoda et al. |
| 4,922,286 | 5/1990 | Tanabe ............... 355/27 |
| 4,942,419 | 7/1990 | Nakai et al. ............... 355/27 |
| 4,949,185 | 8/1990 | Nakai . |
| 4,956,662 | 9/1990 | Sakai et al. |
| 4,967,227 | 10/1990 | Suzuki et al. ............... 355/27 |
| 5,016,042 | 5/1991 | Yamamoto et al. ............... 355/27 |
| 5,043,759 | 8/1991 | Sakai ............... 355/27 |
| 5,049,918 | 9/1991 | Hisada et al. ............... 355/27 |
| 5,049,920 | 9/1991 | Sangyoji et al. ............... 355/27 |
| 5,049,922 | 9/1991 | Kazuya et al. ............... 355/32 |
| 5,051,772 | 9/1991 | Hattori ............... 355/27 |

Primary Examiner—Monroe H. Hayes
Attorney, Agent, or Firm—Oliff & Berridge

[57] ABSTRACT

An image forming apparatus capable of forming an image on a photosensitive recording medium employs a plurality of mask members for exposure prepared on the basis of image data representing the image. The mask members are to be registered sequentially at an exposure position on the photosensitive recording medium. The image forming apparatus comprises a supporting unit for supporting the mask members, the supporting unit being transported from an initial position to a different position including the exposure position, and a moving unit for moving the supporting unit to position the mask member in the exposure position, while the supporting unit is being transported from the initial position to the selected position including the exposure position. An exposure unit exposes the photosensitive recording medium through the mask member positioned in the exposure position. The image forming apparatus provides a returning unit for returning the supporting unit from the exposure position to the initial position, after exposure has been completed by the exposure unit, and a discharging unit for discharging the mask member from the exposure position to a discharging position, after exposure has been completed by the exposure unit. A controlling unit controls the discharging unit and the returning unit so that the mask member is discharged from the exposure position to the discharging position before the supporting unit begins to be returned to the initial position by the returning unit.

8 Claims, 9 Drawing Sheets

IMAGE FORMING APPARATUS USING MASK ORIGINAL FORM

BACKGROUND OF THE INVENTION

1. Field of the Invention

The present invention relates to an image forming apparatus for exposing a photosensitive medium to light using a mask member, and more particularly to an image forming apparatus capable of maintaining and feeding the mask member to the correct position on the photosensitive medium in a time-expedient manner.

2. Description of Related Art

An image forming apparatus is known which uses, for example as in U.S. Pat. No. 4,810,614, light transmitting sheets (hereinafter referred to as mask members) having images thereon in black that are obtained by extracting red, green and blue components of a colored original image. With the image forming apparatus, photosensitive recording paper to which color capsules are applied, is sequentially exposed to filtered light using the three mask members to form an image.

An image forming apparatus which is shown in U.S. Pat. Nos. 4,884,082, 4,949,185 and 4,956,662 is operatively joined with a monochromatic printer. The monochromatic printer is a laser printer, in which a polygon scanner applies laser light over a precharged photosensitive drum to form an electrostatic latent image thereon. The photosensitive drum is then developed by a developing device whereupon the toner image on the photosensitive drum is transferred onto plain paper, or an overhead projector (OHP) sheet, supplied from a sheet cassette and is then fixed to the paper by an image fixing device. Usually, the laser printer records data transmitted from a non-illustrated host computer. In the meantime, the apparatus records a picture image by using three mask members. The laser printer produces the three mask members according to original color picture image information. When it is necessary to output a usual monochromatic picture image, a sheet of paper, on which a monochromatic picture image output from the laser printer is fixed, is fed to a discharge tray. When it is necessary to output a color picture image in the image forming apparatus, the three mask members, that is, one mask member for red, another mask member for green and a further mask member for blue are formed by a laser printer and are inserted into the image forming apparatus.

FIG. 9 is a sectional view showing a part of the route transmitted by a mask member in an image forming apparatus of the type which is shown in U.S. Pat. No. 4,949,185. A mask member 115R for red, another mask member 115G for green and a further mask member 115B for blue are formed by a laser printer or the like (not shown) and are inserted one-by-one into an inlet port 126 of the apparatus as shown in FIG. 9.

After the mask member 115R, for red, is inserted, it is transported downwardly to a left end of an endless belt 102 which extends in a horizontal direction. Endless belt 102 is formed from a transparent material and is electrically charged by a charging device (not shown). Thus, the mask member 115R is fixed to the endless belt 102 by force of static electricity and transported in the fixed condition by circulation of the endless belt 102. When the mask member 115R arrives at a predetermined exposure position, circulation of the endless belt 102 is stopped in a manner described below.

A sensor bar 105 supporting positioning mark sensors and mask member identifying mark sensors is positioned near one end of the feed belt 102. The positioning mark sensors serve to read positioning marks printed on predetermined portions of a mask member 115 for locating the mask member 115 in a given position, and the mask member identifying mark sensors serve to identify the color of the mask member 115 as described below.

FIG. 10 shows in detail the sensor bar 105 and the mask member 115. The mask member 115 includes a non-image area 115a bearing a mark M1 for indicating the position of the mask member 115 in the direction indicated by the arrow x, a mark M2 for indicating the position of the mask member 115 in the direction indicated by the arrow y, and marks M3, M4 for indicating the color of the mask member 115. The sensor bar 105 has sensors S1 thru S5. The sensors S1 and S2 are adapted for detecting the position of the mask member 115 in the direction indicated by the arrow x by sensing the marks M1, M2, respectively. The sensor S3 is adapted for detecting the position of the mask member 115 in the direction indicated by the arrow y by sensing the mark M2. The sensors S4 and S5 are adapted for identifying the mask member 115 by sensing the marks M3, M4, respectively. Each of these sensors is in the form of a light-reflecting sensor comprising an LED and a photodiode, and senses the mark based on the difference between the reflectances of the mark and the background surface of the non-image area 115a.

The charging device electrostatically attracts the mask member 115R to the feed belt 102, and the feed belt 102 feeds the mask member 115 into an exposure position therein along the direction of the arrow x. Thereafter, the feed belt 102 is moved by actuators (not shown) in the directions indicated by the arrows y in FIG. 10 until the mask member 115R is properly positioned in the exposure position while the positioning marks M1, M2 on the mask member 115R are being sensed by the positioning mark sensors S1, S2, S3 on the sensor bar 105.

A photosensitive recording medium 106 drawn out from a cartridge 104 extends below and parallel to the endless belt 102. A microcapsule paper, such as that disclosed in U.S. Pat. No. 4,399,209, may be adopted as the photosensitive recording medium 106. An exposure operation is performed while the photosensitive recording medium 106 and the mask member 115R are stopped opposed to one other at the exposure position. A lamp 108, serving as a light source for the exposure, is disposed above the endless belt 102 and three filters 110R, 110G and 110B for red, green and blue, respectively, are disposed below the lamp 108 such that they may selectively cover the lamp 108. Thus, the lamp 108 is first covered by the filter 110R for red. Lamp 108 and the filter 110R are integrally moved from a left end to a right end of the endless belt 102. Only the red component of the light from the lamp 108 is passed by the filter 110R and reaches the mask member 115R through the transparent endless belt 102. The red light component passes through the portion of the mask member 115R where there is no image or toner, that is at points that are not black, and is blocked by the black image portion of the mask member 115R. Consequently, the exposed surface of the photosensitive recording medium 106 is sensitized by red light in accordance with an image of the mask member 115R so that a latent image for red is formed thereon. After completion of such processing, the endless belt 102 is circulated to feed the mask member 115R to the right. The mask member 115R is fed out of the exposure position and transported upwardly along a route to the right of the apparatus as shown. The route branches into two routes at a position 114, the two routes leading to first and second buffers 116a and 116b, respectively. Mask member 115R is fed into the upper route by a gate 118 provided at the branching position 114 and consequently is stored in the first buffer 116a.

Simultaneous with such storage of the mask member 115R, the mask member 115G, for green, is inserted into the image forming apparatus through the inlet port 126. The mask member 115G is then transported along the same route previously transmitted by the mask member 115R until it comes to the exposure position. It is to be noted that the photosensitive recording medium 106 is not transported during this operation. After the mask member 115G is positioned opposite to the photosensitive recording medium 106, the lamp 108 is moved from the left end to the right end of the endless belt 102 while covered by the filter 110G, thereby performing an exposure operation with only green light.

After exposure of the photosensitive recording medium 106 with green light, the mask member 115G is transported rightwardly by circulation of the endless belt 102 and fed at the branching position 114 into the lower route by the gate 118 so that it is stored in the second buffer 116b. Simultaneously, the mask member 115B, for blue, is inserted and transported to the exposure position. An exposure operation of the photosensitive recording medium 106 with blue light is performed in a manner similar to that previously performed with red and green light.

Thus, latent images for red, green and blue are formed in an overlapping relationship on the same surface of the photosensitive recording medium 106 by the multiple exposure of the three exposure operations. The exposed portion of the photosensitive recording medium 106 is then transported to a developing station while a new portion of the photosensitive recording medium 106 is drawn out from the cartridge 104 and introduced to the exposure position at which it is opposed to the endless belt 102.

Meanwhile, the mask member 115B is transported rightwardly and introduced into the first buffer 116a by the gate 118. Simultaneously, the mask member 115R, which has been stored in the first buffer 116a, is transported leftwardly to rejoin the route from the inlet port 126 side so that it is again transported to the exposure position, thereby reinitiating the exposure sequence.

In this manner, the mask members 115 are successively transported to the exposure position in a loop defined by the routes for mask member 115 movement provided in the apparatus. The gate 118 is controlled in accordance with the position of one of the buffers 116a and 116b in which a subsequently required mask member 115 is stored. After a predetermined number of images are formed in the manner described above, the mask members 115 are individually discharged by way of exit 120.

The endless belt 102 transports the mask member 115 in the Y-direction (FIG. 10) to register the mask member correctly. Immediately after the completion of exposure using the mask member 115, the endless belt 102 returns to its initial position together with the mask member 115 to receive the next mask member 115. The mask member 115 is moved toward the first buffer 116a or the second buffer 116b.

Each mask member 115 must be transported from the buffer 116a or the second buffer 116b to the exposure position and must be registered repeatedly with respect to the Y-direction to form a single image, thus requiring much time for registering the mask members 115.

SUMMARY OF THE INVENTION

Accordingly, it is an object of the present invention to provide an image forming apparatus for producing a color picture using a plurality of mask members, the apparatus being capable of maintaining the correct position of each mask member by adjusting the tilt and horizontal dislocation of the mask member with respect to a certain position in an accurate and quick manner so that the positional adjustment of each mask member can be completed quickly in preparation for the next image forming cycle.

According to the present invention, there is provided an image forming apparatus to form an image on a photosensitive recording medium by exposing the medium to light using each of plural mask members to form a component part of the image, each mask member to be selectively positioned in an exposure position on the photosensitive recording medium, the image forming apparatus comprising: a supporting means for supporting the mask members, the supporting means being transported from an initial position to a different position including the exposure position; a moving means for moving the supporting means to position the mask member in the exposure position while the supporting means is being transported from the initial position to the different position including the exposure position; an exposure means for exposing the photosensitive recording medium to light through the mask member positioned in the exposure position; a returning means for returning the supporting means from the exposure position to the initial position after exposure has been completed by the exposure means; a discharging means for discharging the mask member from the exposure position to a discharging position after exposure has been completed by the exposure means; and a controlling means for controlling the discharging means and the returning means so that the mask member is discharged from the exposure position to the discharging position before the supporting means begins to return to the initial position by the returning means.

According to the present invention thus constructed, the moving means moves the supporting means to position the mask member in the exposure position, while the supporting means is being transported from the initial position to the different position including the exposure position. An exposure means exposes the photosensitive recording medium through the mask member positioned in the exposure position. Immediately after exposure has been completed by the exposure means, the mask member is discharged from the exposure position to the discharging position before the supporting means begins to return to the initial position by the returning means. Thus, the mask member supported on the supporting means is held in a correct position, so that the next image forming cycle can quickly be completed.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENTS

Hereinafter, an embodiment of the present invention will be described in detail with reference to the drawings.

Figure 1:
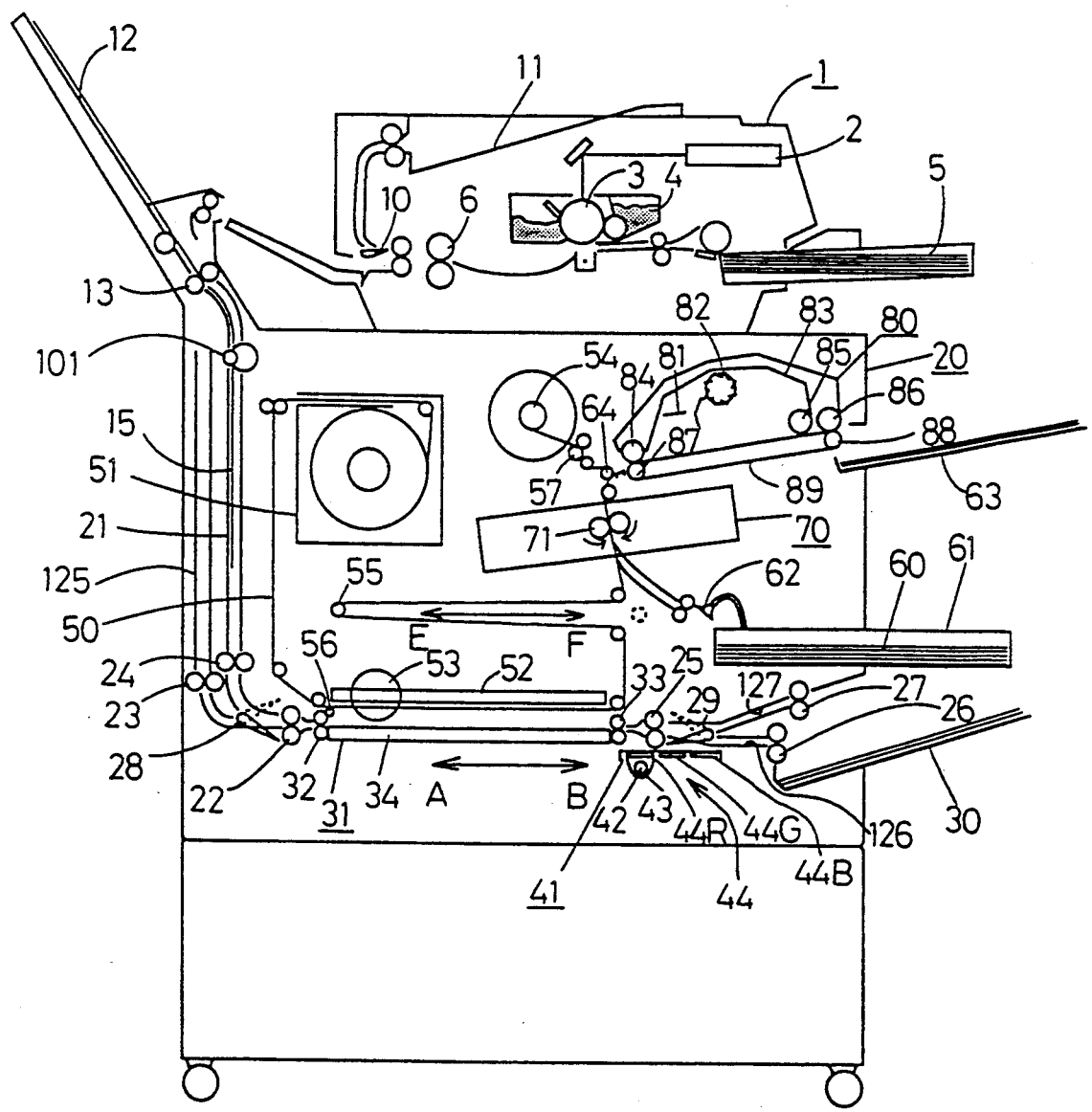
FIG. 1 is a schematic sectional view of an image forming apparatus in a preferred embodiment according to the present invention.

FIG. 1 is a sectional view showing a monochromatic laser printer 1 and a color image recording apparatus 20 arranged in a coupled condition. For illustrative purposes, the monochromatic laser printer 1 is placed on top of the color image recording apparatus 20.

In the laser printer 1, a laser beam is directed at an electrically charged photosensitive member or drum 3 by means of a polygon scanner 2 to form an electrostatic latent image on the photosensitive drum 3. The electrostatic latent image formed on the photosensitive drum 3 is then developed by a developing means 4. A toner image formed by such development is transferred to a plain paper sheet or an overhead projector (transparent) sheet supplied from a sheet cassette 5. The toner image is then fixed to the sheet by a fixing means 6. Normally, the monochromatic laser printer 1 records data transmitted from a host computer.

The sheet output from the laser printer 1 is directed into one of two routes by a sheet path selector 10. When a white/black image is required, the sheet is directed to a monochromatic discharge tray 11 or an automatic document feeder (hereinafter referred to as ADF) tray 12. When a color image is required, the sheet is directed first to the ADF tray 12 and then fed into the color image recording apparatus 20.

Sheets directed to the ADF tray 12 in this manner are then supplied, one-by-one, into the color image recording apparatus 20 by an ADF roller 13. A set of three such sheets, which have been output from the laser printer 1 and have monochromatic prints thereon, constitute a set of mask members 15 (15R, 15G and 15B) for subsequent use in the color image recording apparatus 20. Each of the mask members 15 thus output normally has a curl toward the side on which the image is formed. Correction of this curl will be addressed during the description of the color image recording apparatus 20.

The color image recording apparatus 20 has a positioning means 31 disposed at a lower location in the body. A mask member transport path 21 extends from the ADF tray 12 to the positioning means 31. Roller pairs 22, 23, 24, 25, 26 and 27, gates 28 and 29 for changing the mask member route, and a mask member accommodating section 125 are provided on the left and right sides, as shown in FIG. 1, of the positioning means 31.

The roller pairs 22, 23, 24, 25, 26 and 27 are controlled to rotate forwardly and reversely by a microcomputer programmed to control the formation of the copy image. By such processing, a mask member 15 is advanced and returned along the transport path. Timings for the advance and return movement of a mask member 15 will be further described.

A recurler roller pair 101 for removing a curl of a mask member 15 output from the laser printer 1 is disposed intermediate of the mask member transport path 21.

A mask member discharge tray 30 for receiving a mask member 15 after use and discharging it from the recording apparatus 20 is provided on the outer side of the roller pairs 26 and 27. The route traversed by mask member 15, including the roller pair 26, which serves as the accommodating section 126, extends linearly in parallel to a face of glass plate 34. Further, the route that includes roller pair 27, which serves as the accommodating section 127, also extends substantially linearly to a face of glass plate 34. Accordingly, jamming of a mask member 15 is unlikely along either of the routes.

The positioning means 31 includes a sensor (not shown) for aligning the mask member 15, the roller pairs 32 and 33 disposed adjacent left and right end portions of the positioning means 31, and a glass plate 34 disposed between the roller pairs 32 and 33. An exposure device 41 is disposed below the positioning means 31 such that it is movable in leftward and rightward directions along the lower surface of positioning means 31. Exposure device 41 comprises a linear white light source (hereinafter referred to only as lamp) 42, a reflecting member 43 for reflecting light from the lamp 42, and a filter means 44 including a red filter 44R, a green filter 44G and a blue filter 44B.

A photosensitive recording medium 50 is composed of a web serving as a base material with a photosetting resin material and microcapsules applied to the web. The photosetting resin material contains, as a main material, a photopolymerization initiator as is known, for example, from U.S. Pat. No. 4,399,209 and Japanese Laid-Open Patent No. 143044/1987, and is hardened by light of the wavelengths for red, green and blue. The microcapsules individually contain dye precursors of cyan, magenta or yellow. The photosensitive recording medium 50 is mounted in a cartridge so that it is not prematurely exposed to light. The photosensitive recording medium 50 is drawn from the cartridge 51 and first passes between the glass plate 34 and an exposure table 52. It is wound around a takeup roller 54 after passing a buffer 55, a pressure developing means 70, a separating roller 64 and a drive roller 57.

When an exposure operation is to be performed by the exposure device 41, exposure table 52 is moved in a downward direction by a cam 53 so that a mask member 15, which has been transported onto the glass plate 34 by the roller pair 32, is closely contacted with the photosensitive recording medium 50. Meanwhile, a fastening roller 56 is located adjacent to a left end of the exposure table 52 so that, when the exposure table 52 is moved down to a predetermined position, the fastening roller 56 is pressed against a left end portion of the exposure table 52. As a result, while an exposure operation is taking place using one of the mask members 15R, 15G or 15B, the photosensitive recording medium 50 is held between and fixed by the exposure table 52 and fastening roller 56.

Color developer sheets 60, comprised of sheets having a color developer as disclosed, for example, in Japanese Laid-Open Patent No. 88739/1983, are set in the cassette 61 such that the face to which the color developer is applied is directed downwardly. The color developer sheets 60 are supplied to the pressure developing means 70 one-by-one from the cassette 61 by a suction cup 62 which is intermittently driven by a driving source (not shown). The color developer sheet 60 is pressured by a pair of pressure rollers 71 of the pressure developing means 70 while it is held in an overlapping relationship with the photosensitive recording medium 50 that has been exposed to light. Consequently, the latent image formed on the photosensitive recording medium 50 by the exposure operation is changed into a visible image on the color developer sheet 60.

A thermal fixing means 80 comprises a casing 83, a heater 81 and a vane wheel 82 located therein at upper locations, rubber rollers 84, 85 and 86 for the transportation of a color developer sheet 60 at a lower location, and an endless belt 89 extending between a pair of rollers 87 and 88.

The color developer sheet 60 fed from the pressure developing means 70, and separated from the photosensitive recording medium 50 by the separating roller 64, is then glazed by the thermal fixing means 80 and discharged to discharge tray 63.

Figure 2:
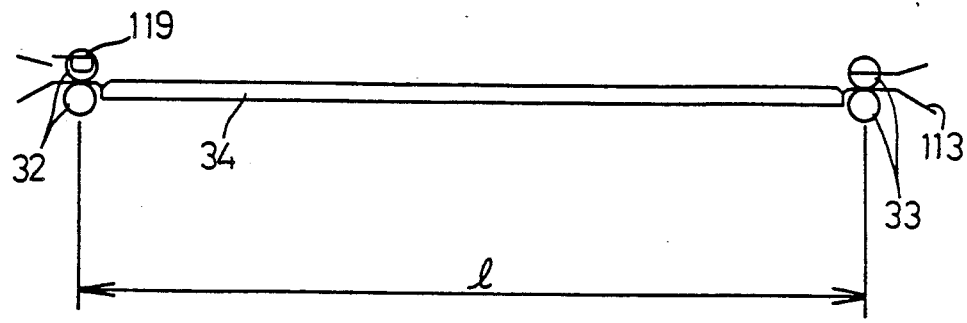
FIG. 2 is a schematic sectional view of a portion of a positioning means employed in the image forming apparatus of FIG. 1.

The construction of the positioning means 31 will be described with reference to FIGS. 2 and 3.

Pairs 32 and 33 of rollers for moving the mask 15 in directions indicated by a double-headed arrow G are driven by a motor 111 through the output shaft 111a of the motor 111, a gear 111b and shafts 111c, 111d and 111e. A positioning frame 113 is mounted on a main frame 112 for movement in a horizontal plane. The respective shafts 111c and 111e of the pairs 32 and 33 of rollers are journaled on the positioning frame 113.

The positioning frame 113 is linked with the main frame 112 by a first link 114, a second link 115 and a third link 116. The second link 115 and the third link 116 are moved in directions indicated by a double-headed arrow H and I by motors 117 and 118, respectively, through the output shafts 117a and 118a of the motors 117 and 118 and gears 117b and 118b. A glass plate 34 is disposed in the central portion of the positioning frame 113. The mask moved by the pairs 32 and 33 of rollers along the glass plate 34 is exposed to light transmitted through the glass plate 34. A sensor support member 119 is disposed near the pair 32 of rollers and is attached to the main frame 112. Register marks 120 are printed in the left margin of the mask member 15 in printing the image information. Reflection optical sensors, not shown, are supported on the sensor support member 119 so as to correspond to read positions 121, 122 and 123 on the mask 15. The sensors read the positioning marks 120 in the vicinity of the read positions 121, 122 and 123.

The center distance l between the pairs 32 and 33 of rollers is smaller than the length of the mask member 15, so that the mask member 15 is held by at least one of the pair 32 of rollers or the pair 33 of rollers.

Figure 5:
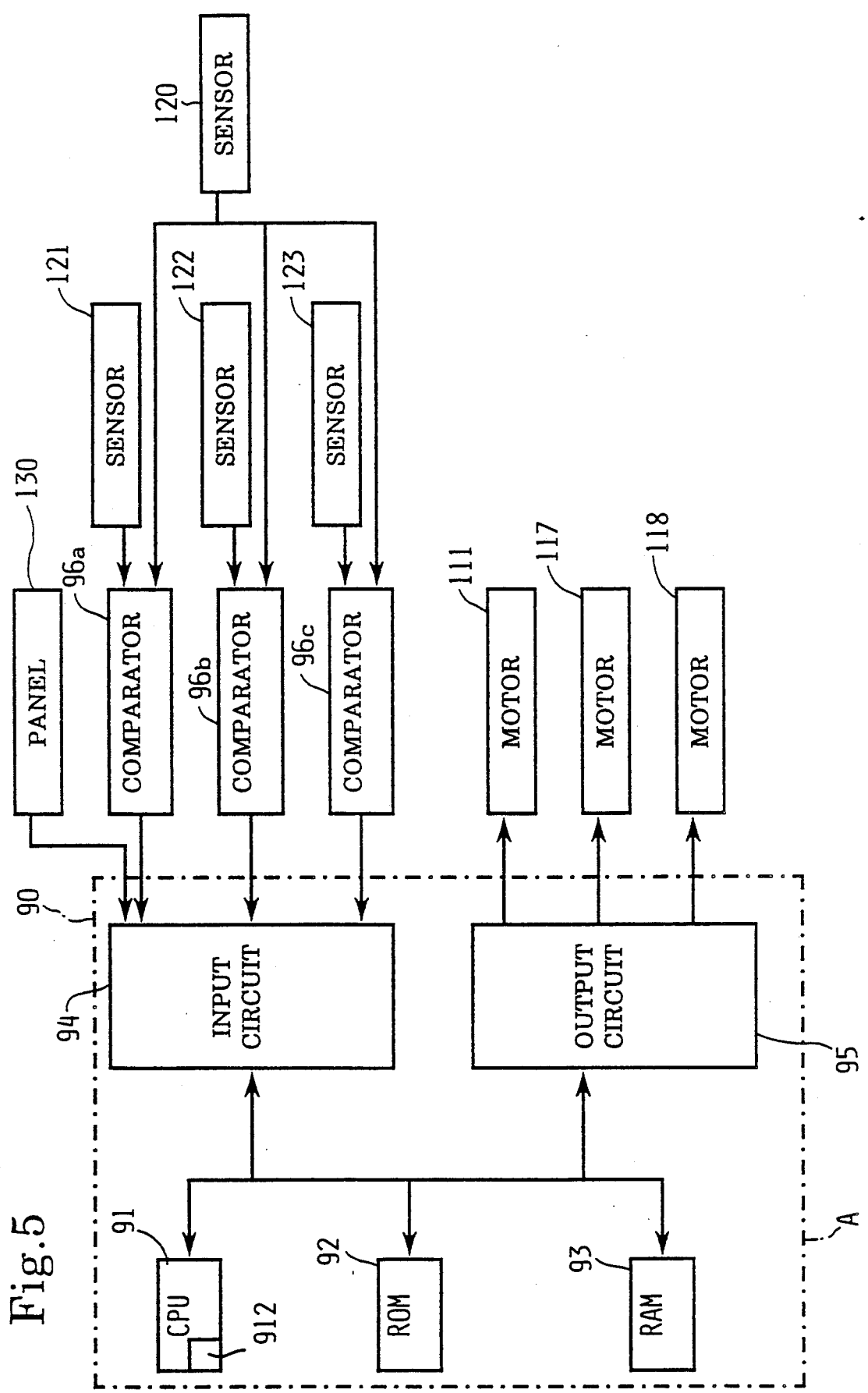
FIG. 5 is a block diagram of a control means for controlling the positioning means of FIG. 2.

The motors 111, 117 and 118 of the positioning means 31 are controlled by a control means A shown in FIG. 5 to move the positioning frame 113 in a horizontal plane in directions indicated by the double-headed arrows G, H and I so that the positioning marks 120 formed on the mask member 15 are detected by the optical sensors. The output shafts 111a, 117a and 118a of the motors 111, 117 and 118 are turned in a predetermined direction, for example, in a clockwise direction, from their initial positions, respectively.

The output shafts 111a, 117a and 118a of the motors 111, 117 and 118 are turned through predetermined angles, respectively, to move the positioning frame 113 in a predetermined range within the horizontal plane.

The initial positions of the output shafts 117a and 118a of the motors 117 and 118 correspond to the initial position of the positioning frame 113 from which the positioning frame 113 is moved in the directions indicated by the double-headed arrows H and I.

When the positioning frame 113 is at the initial position, the longitudinal center line D of the positioning frame 113 is in alignment with the longitudinal center line P of the first link 114.

The mask member 15 fed from the ADF tray 12 into the mask transporting path 21 is not necessarily delivered to a predetermined position with respect to the directions indicated by the double-headed arrows H and I and, in most cases, the mask member 15 is delivered to an incorrect position.

The motors 111, 117 and 118 move the positioning frame 113 in directions indicated by the double-headed arrows H and I and move the mask member in the directions indicated by the double-headed arrow G so that the positioning marks 120 are detected by the optical sensors. In most cases, the positioning frame 113 is dislocated from its initial position when the mask member 15 is located at the exposure position, namely, a correct position, and a considerable amount of time is required for locating the positioning frame at its exposure position.

Therefore, a significantly long period of time is lost when the positioning frame 113 is repeatedly moved in the directions indicated by the double-headed arrows H and I. If the mask member 15, once positioned correctly at the exposure position, is delivered correctly again to the exposure position on the glass plate 34 after being returned to and stored in the mask member accommodating sections 125, 126 or 127 in forming an image repeatedly on a plurality of recording sheets, the positional adjustment of the positioning frame 113 with respect to the directions indicated by the double-headed arrows H and I is unnecessary and considerable time is saved.

The positioning frame 113 is returned to its initial position after the mask member 15 has been returned from a position on the glass plate 34 to the mask member accommodating section 125, 126 or 127 to secure a maximum range of movement of the positioning frame 113 for correctly positioning the next mask member 15 delivered from the ADF tray 12 to the positioning means 31.

The image forming apparatus embodying the present invention will be described with reference to FIG. 5. The image forming apparatus is provided with the control means A comprising a CPU 91, a ROM 92, a RAM 93, an input circuit 94 and an output circuit 95. Comparators 96a, 96b and 96c are connected to the input circuit 94. A reference sensor 120 is connected to the comparators 96a, 96b and 96c, and sensors 121, 122 and 123 are connected, respectively, to the comparators 96a, 96b and 96c. The reference sensor 120 consists, for example, of a LED and a phototransistor, and adjusts the temperature-dependent sensitivities of the sensors 121, 122 and 123 by changing the respective thresholds of the sensors 121, 122 and 123. Data provided by the reference sensor 120 and the sensors 121, 122 and 123 are received by the input circuit 94. The motors 111, 117 and 118 are driven according to data provided through the output circuit 95. A panel 130 for entering the number of prints of the same image to be produced is connected to the input circuit 94. The CPU 91 is provided with a counter 912 for counting the number of prints produced.

Operation of the image forming apparatus having the construction as described above, when a plurality of color outputs are to be obtained from a set of mask members 15, will now be described.

First, a mask member 15R for red is produced by the monochromatic laser printer 1. The mask member 15R is a mask member which has toner on those points where all microcapsules, containing dye precursors of yellow, cyan or magenta, are to remain unexposed or uncured and has clear areas to pass red light for curing or hardening the cyan microcapsules of the photosensitive recording medium 50. Subsequent actions, to be described, using mask members 15G and 15B with filters for providing green and blue light through the clear positions of the mask member will cure or harden the magenta and yellow microcapsules, respectively. In this instance, the mask member 15R output from the monochromatic laser printer 1 is sent to the ADF tray 12 and from there supplied to the color image forming apparatus 20 by the ADF roller 13.

Mask member 15R, when it is supplied into the color image recording apparatus 20, has a curl to the side of sheet on which the image is formed. Mask member 15R follows the mask member transport path 21 and is fed to the recurler roller pair 101. Mask member 15R is thus recurled by the recurler roller pair 101 and then fed into the positioning means 31 by the roller pairs 24 and 22. In this instance, the gate 28 remains at the position indicated by solid lines in FIG. 1.

Then, the positioning means 31 transports the mask member 15R to the predetermined exposure position by the roller pair 32. Mask member 15R is accurately positioned by means of a driving source using a positioning mark printed on the mask member 15R that is read by means of a sensor (not shown).

It is to be noted that immediately before such positioning is performed, the exposure table 52 is moved down to the predetermined position by the cam 53 until the left end portion thereof is contacted with the fastening roller 56 so that the photosensitive recording medium 50 is fixed to the exposure table 52. After completion of such positioning, the exposure table 52 is further moved down by cam 53 until it is in contact with the glass plate 34 of the positioning means 31. In this position, the mask member 15R and the photosensitive recording medium 50 are in close contact with one other.

After the exposure table 52 is brought into close contact with the positioning means 31, the lamp 42 is lit, with filter 44R in position over it, so that red light passes through the mask member 15R and irradiates the photosensitive recording medium 50. Since the exposure device 41 performs a scanning exposure in the direction indicated by arrow A, the entire photosensitive recording medium 50 on the exposure table 52 is exposed to the light. After completion of the exposure, the lamp 42 is extinguished, and the exposure device 41 is returned to its initial position in the direction indicated by arrow B. At this time, the filter means 44 is rotated by a driving source (not shown) so that the green filter 44G is positioned above the lamp 42.

While the exposure device 41 is being returned to its initial position, the exposure table 52 is moved up by rotation of the cam 53 to space the photosensitive recording medium 50 away from the positioning means 31 and mask member 15R.

Back tension is normally applied to the photosensitive recording medium 50 from the center of rotation of the roll of the photosensitive recording medium 50, by means of a spring-biased frictional coupling between the shaft supporting the photosensitive recording medium 50 and a part of the apparatus frame (not shown), located in the cartridge 51. Accordingly, when the exposure table 52 is moved down, the photosensitive recording medium 50 is drawn from within the cartridge 51 by a length corresponding to the distance of downward movement of the exposure table 52, but when the exposure operation is completed and the exposure table 52 is moved up, the photosensitive recording medium 50 is rewound in a direction to take up any resulting slack.

After completion of the exposure by the mask member 15R for red, the exposure table 52 is moved up to the predetermined position by the cam 53. In this instance, since the fastening roller 56 remains in contact with the left end portion of the exposure table 52, the photosensitive recording medium 50 remains fixed with respect to the exposure table 52.

At this time, the motor 117 of the positioning means 31 is driven, and the green filter 44G is located above the lamp 42.

When the exposure device 41 is driven for return travel, the exposure table 52 is raised by the cam 53 to separate the photosensitive recording medium 50 from the positioning means 31 and the mask 15R. Since the roll of the photosensitive recording medium 50 is urged in a winding direction to apply a back tension to the photosensitive recording medium, a length of the photosensitive recording medium corresponding to the distance of downward movement of the exposure table 52 is pulled out from the cartridge 51 when the exposure table is lowered and returned to the cartridge when the exposure table 52 is raised.

After the completion of the exposure operation for forming a red image by using the red mask 15R, the exposure table 52 is raised to a predetermined position and the photosensitive recording medium 50 is fixedly held on the exposure table 52 by a fixing roller 56 pressed against the left end of the exposure table 52.

The motor is driven to return the positioning frame 113 to its initial position, where the positioning frame 113 is kept on standby in a first operating mode.

Subsequently, mask member 15G for green is produced by the monochromatic laser printer 1, and when the mask member 15G reaches a position directly forward of the roller pair 24 and past the ADF tray 12, ADF roller 13, recurler roller pair 101 and mask member transport path 21, the roller pairs 24, 22, 25 and 27 and the roller pairs 32 and 33 of the positioning means 31 are rotated to transport the mask member 15R in the rightward direction to remove the mask member 15R from the positioning means 31. Simultaneously, the mask member 15G is transported to and stopped at the exposure position. In this instance, the gates 28 and 29 are at the positions indicated by solid lines. Thus, the mask member 15R after exposure is transported into the upper branch path. Since the route extending from the roller pair 25 to the roller pair 27 past the gate 29 extends substantially linearly, jamming of a mask member 15 rarely occurs. Then, after a trailing end of the mask member 15R passes the gate 29 to allow subsequent changing over of the gate 29 to the position indicated by dotted lines, rotation of the roller pair 27 is stopped. Consequently, the mask member 15R is suspended above the mask member discharge tray 30 as it is partially held by the roller pair 27. Since the mask member discharge tray 30 is provided on a side of the body of the color image recording apparatus 20, the operator has ready access to the mask member 15R in such a standby condition.

The mask member 15G, introduced into the positioning means 31, is positioned relative to the photosensitive recording medium 50 in the same manner as described for mask member 15R. Exposure table 52 is moved down to bring the mask member 15G into close contact with the glass plate 34 together with the photosensitive recording medium 50. The lamp 42 is then lit to effect an exposure operation with green light by way of the green filter 44G. After completion of the exposure operation, the exposure table 52 is moved up to the predetermined position. The exposure device 41 is moved back to its initial position while the filter means 44 is moved to position the blue filter 44B above the lamp 42.

Subsequently, a further mask member 15B for blue produced by the monochromatic laser printer 1 is fed into the color image recording apparatus 20 in the same manner as described above for the mask members 15R and 15G. After the mask member 15B is transported to the position directly forward of the roller pair 24, the roller pairs 24, 22, 25 and 26 and the roller pairs 32 and 33 of the positioning means 31 are rotated in a direction to transport the mask member 15G in the rightward direction.

Consequently, the mask member 15G is fed from the positioning means 31 while, simultaneously, the mask member 15B is transported to and stopped at the exposure position. In this instance, the gate 28 is at the position indicated by solid lines while the gate 29 is at the position indicated by broken lines. The mask member 15G, after exposure, is transported by the roller pair 26 until a trailing end thereof passes the gate 29. Thus, the mask member 15G is held in such a condition that it is partially clamped by the roller pair 26 and suspended above the mask member discharge tray 30.

The mask member 15B introduced into the positioning means 31, is placed in close contact with the photosensitive recording medium 50 by the operation as described above, and in this condition, the photosensitive recording medium 50 is exposed to blue light.

The motors 117 and 118 of the positioning means 31 are then actuated to return the positioning frame 113 to the initial position.

By the operations described above, a latent image of a desired color image is recorded on the photosensitive recording medium 50. Subsequently, the exposure table 52 is moved up to its initial position. Thereupon, the fastening roller 56 and the left end portion of the exposure table 52 are spaced away from each other to release the photosensitive recording medium 50 and the buffer 55 is moved in the direction indicated by arrow E. As a result of the movement of the buffer 55, an unexposed portion of the photosensitive recording medium 50 is moved to a position below the exposure table 52 as photosensitive recording medium 50 is withdrawn from the cartridge 51.

The drive roller 57 is stopped when a leading end portion of the latent image on the photosensitive recording medium 50 comes to a position adjacent to the pressure roller 71 of the pressure developing means 70.

A color developer sheet 60 is fed from within the cassette 61 by the suction cup 62 in synchronization with the movement of the photosensitive recording medium 50. The color developer sheet 60 is stopped at a position at which a leading end thereof corresponds to the leading end of the latent image of the photosensitive recording medium 50.

Then, the pressure roller 71 of the pressure developing means 70 is rotated in the direction indicated by the arrow by a known driving device (not shown) to press, under pressure, the color developer sheet 60 with that portion of the photosensitive recording medium 50 on which the latent image is formed.

Simultaneously, the exposure table 52 is moved down to the predetermined position until the left end thereof is in contact with the fastening roller 56, thereby fixing the photosensitive recording medium 50 to the exposure table 52.

The photosensitive recording medium 50 is then fed, under pressure and in contact with the color developer sheet 60, through developing means 70. Consequently, those of the microcapsules on the photosensitive recording medium 50 which have not yet been hardened are ruptured by the pressure so that the color contained therein reacts with the developer on the color developer sheet 60 and a color image corresponding to the latent image on the photosensitive recording medium 50 is developed on the color developer sheet 60.

As the pressure roller 71 of the pressure developing means 70 is rotated further in the direction indicated by the arrow, the buffer 55 moves in the direction indicated by arrow F.

When the leading end of the color developer sheet 60 comes to the separating roller 64, the color developer sheet 60 is peeled away from the photosensitive recording medium 50 and guided toward the thermal fixing means 80.

In the thermal fixing means 80, the color developer sheet 60 is heated by air which is heated by the heater 81 and circulated in the casing 83 by the vane wheel 82, thereby promoting color development of the color image of the color developer sheet 60. Simultaneously, a binder polymer (binding resin), for fixing the color developing medium to base paper of the color developer sheet 60, is melted by heat, and consequently, the surface of the color developer sheet 60 becomes smooth and produces a suitable degree of gloss.

The color developer sheet 60, after completion of the color developing and glossing processing, is then discharged into the discharge tray 63.

During the series of operations, including initial pressurized developing, promotion of color development and glossing as described above, the photosensitive recording medium 50 remains held between and fixed by the exposure table 52 and fastening roller 56. Consequently, while the developing processing for one color image is proceeding, exposure processing of a latent image for another color image can be performed on the exposure table 52.

When exposure for a second color image is to be performed using the previously used mask members 15, the mask member 15B at the exposure position is fed out in the leftward direction while the mask member 15R held at the position of the roller pair 27 is fed back into the positioning means 31.

Accordingly, the roller pairs 24, 22, 25 and 27 and the roller pairs 32 and 33 of the positioning means 31 are controlled to rotate so as to transport the mask member 15R in the leftward direction. In this instance, the gates 28 and 29 are at the positions indicated by solid lines in FIG. 1. The mask member 15B is held between the roller pair 24 and travels through the gate 28. When mask member 15B is at a position at which a trailing end of mask member 15B has passed the gate 28, rotation of the roller pair 24 is stopped. Consequently, the mask member 15B is retained at that position by roller pair 24. Mask member 15R, fed into the positioning means 31, is then positioned as described above, and the photosensitive recording medium 50 is exposed to red light when in close contact with the mask member 15R. Subsequently, the mask member 15R is fed out in the leftward direction from the exposure position while the mask member 15G, held by the roller pair 26, is fed into the positioning means 31. In particular, the roller pairs 23, 22, 25 and 26 and the roller pairs 32 and 33 of the positioning means 31 are rotated to transport the mask members 15R and 15G in the leftward direction. In this instance, the gates 28 and 29 are at the positions indicated by broken lines.

The mask member 15R is thus held between and fed by the roller pair 23. After a trailing end of mask member 15R passes the gate 28, rotation of the roller pair 23 is stopped and the mask member 15R is held in the mask member accommodating section 125. Mask member 15G, fed into the positioning means 31, is positioned. Photosensitive recording medium 50 is then exposed to green light while in close contact with the mask member 15G. Subsequently, the mask member 15G is fed out in the rightward direction from the exposure position, and a similar operation is then performed to feed the mask member 15B held at the position of the roller pair 24 into the positioning means 31 in place of the mask member 15G and the photosensitive recording medium 50 is exposed to blue light while in close contact with mask member 15B. As a result, the latent image of the color image is formed on the photosensitive recording medium 50 and the color image is sequentially formed on a color developer sheet 60 as described above. By repeating a similar sequence of operations, a desired number of color images can be produced from a single set of mask members.

Thus, when producing a single copy, the mask member is discharged after returning the positioning means to the initial position while, when producing a plurality of copies, the mask member is discharged without moving the positioning means from the exposure position. The dislocation of the mask is restricted to the least extent, whereby the image forming cycle can be completed quickly and the tilt and dislocation of the mask member in the mask transporting path can be corrected.

After the required number of color images have been produced from the same mask members 15, the mask members 15 are discharged into the accommodating sections 125, 126 and 127 from the roller pair 27 or roller pair 26.

When a second set of mask members 15 is output from the monochromatic laser printer 1 during exposure processing of a series of color images from the first set of mask members 15, the second set of mask members 15 is stored in the ADF tray 12. The stored mask members 15 are then subsequently fed one by one into the color image recording apparatus 20 by the ADF roller 13 after the exposure processing for the preceding set of mask members 15 is completed.

When a set of mask members 15 produced from another monochromatic laser printer is to be used or a set of mask members 15 which has been used previously is to be used again, manual insertion of the mask members 15 into the ADF tray 12 is possible.

Figure 6:
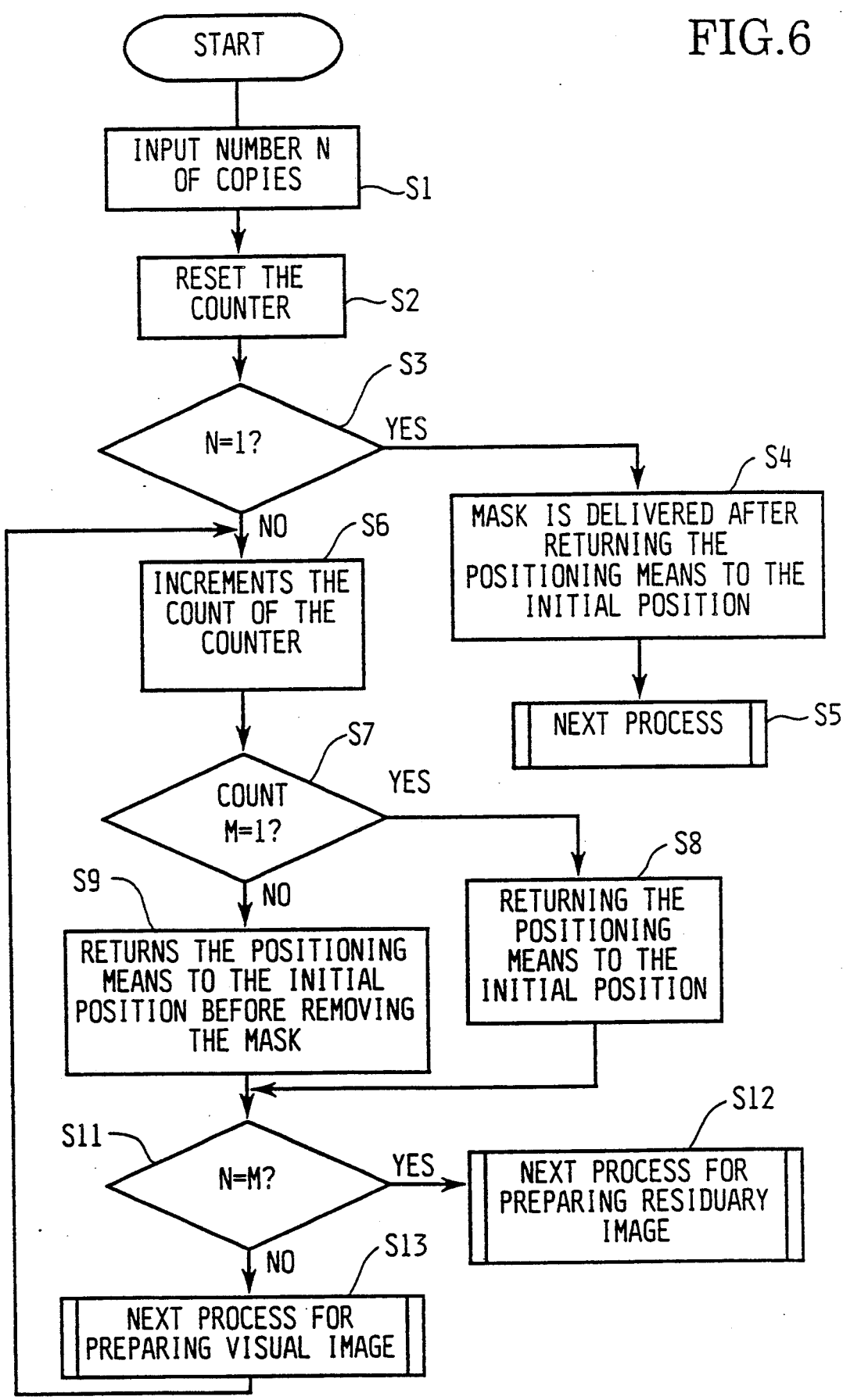
FIG. 6 is a flow chart of a control program to be executed by the control means of FIG. 5.

The function of the CPU 91 for controlling the operation of the image forming apparatus in the first operating mode, in which the mask member 15 is delivered after returning the positioning means 31 to the initial position, and in the second operating mode, in which the mask member 15 is delivered without returning the positioning means 31 to the initial position, namely, without moving the positioning means 31 from the exposure position, will be described with reference to a flow chart shown in FIG. 6.

The number N of copies to be produced is given to the CPU 91 by operating the panel 130 in step S1. Then, in step S2, the CPU 91 resets the counter 912 to clear the count M representing the number of the previously produced copies.

In step S3 the CPU 91 makes a query to see if N=1. When the response in step S3 is affirmative, the mask member 15 is delivered after returning the positioning means 31 to the initial position for operation in the first operating mode (S4). The mask members are delivered successively to the positioning frame 113 to curtail time necessary for image formation. Namely, the next mask member 15 is delivered to the positioning frame 113 while the preceding mask member 15 is being removed from the positioning frame 113 after an exposure operation so that the two mask members 15 are present simultaneously on the positioning frame 113. Thus, the next mask member 15 can be positioned before the preceding mask member 15 is removed from the positioning frame after exposure.

When the response in step S3 is negative, the CPU 91 increments the count of the counter by one in step S6. Therefore, when the count M =0 in step S2, the count M=1 in step S7.

In step S7, the CPU 91 makes a query to see if M=1 When M=1, namely, when the response in step S7 is affirmative, the CPU 91 removes the mask member 15 before returning the positioning means 31 to the initial position in step S8 for operation in the second operating mode.

In the second operating mode, the mask member 15 correctly positioned at the exposure position is transported from its correct position to the mask accommodating section 125, 126 or 127. The mask member 15 is again delivered onto the glass plate 34 provided on the positioning frame 113 and, consequently, the mask member 15 need not be positioned again with respect to the directions indicated by the double-headed arrows H and I.

In step S11, the CPU 91 makes a query to see if N =M. When the response in step S11 is affirmative, namely, if the M copies of the image have been produced by using the mask members 15, the CPU 91 executes the next process for preparing a residual image in step S12. When the response in step S11 is negative, namely, if the M copies of the image have not been produced by using the mask members 15, the CPU 91 executes the next process for preparing a visual image in step S13.

When the response in step S11 is negative, the CPU 91 executes the steps S6 and the following steps again. When the response in step S7 is negative, the CPU 31 returns the positioning means 91 to the initial position before removing the mask member 15 in step S9 for operation in the first operating mode.

In this case, the image forming apparatus operates in the first operating mode because the mask member 15 can correctly be positioned again at the exposure position when the mask member returned to the mask accommodating section 125, 126 or 127 is delivered again onto the glass plate 34. Hence, positioning of the mask member 15 with respect to the directions indicated by the double-headed arrows H and I is unnecessary, and the second operating mode, which requires a waiting time, need not be selected.

Figure 7:
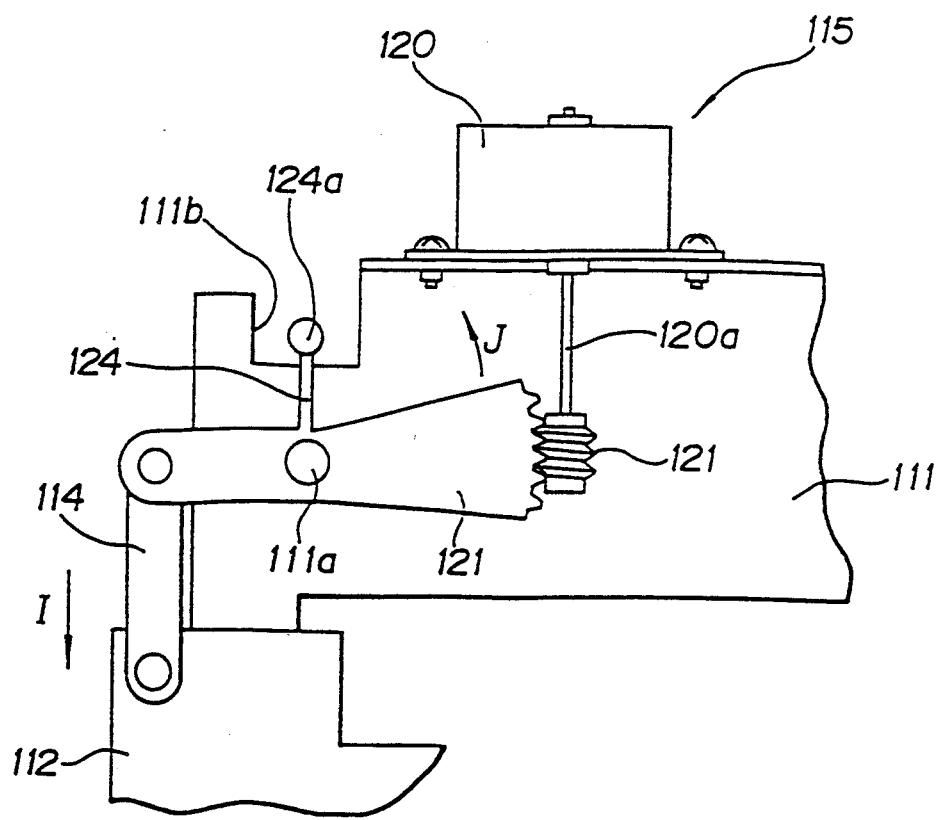
FIG. 7 is a plan view of a portion of the positioning means of FIG. 2.

A portion of the positioning means 31 will be described with reference to FIGS. 7 and 8.

Figure 3:
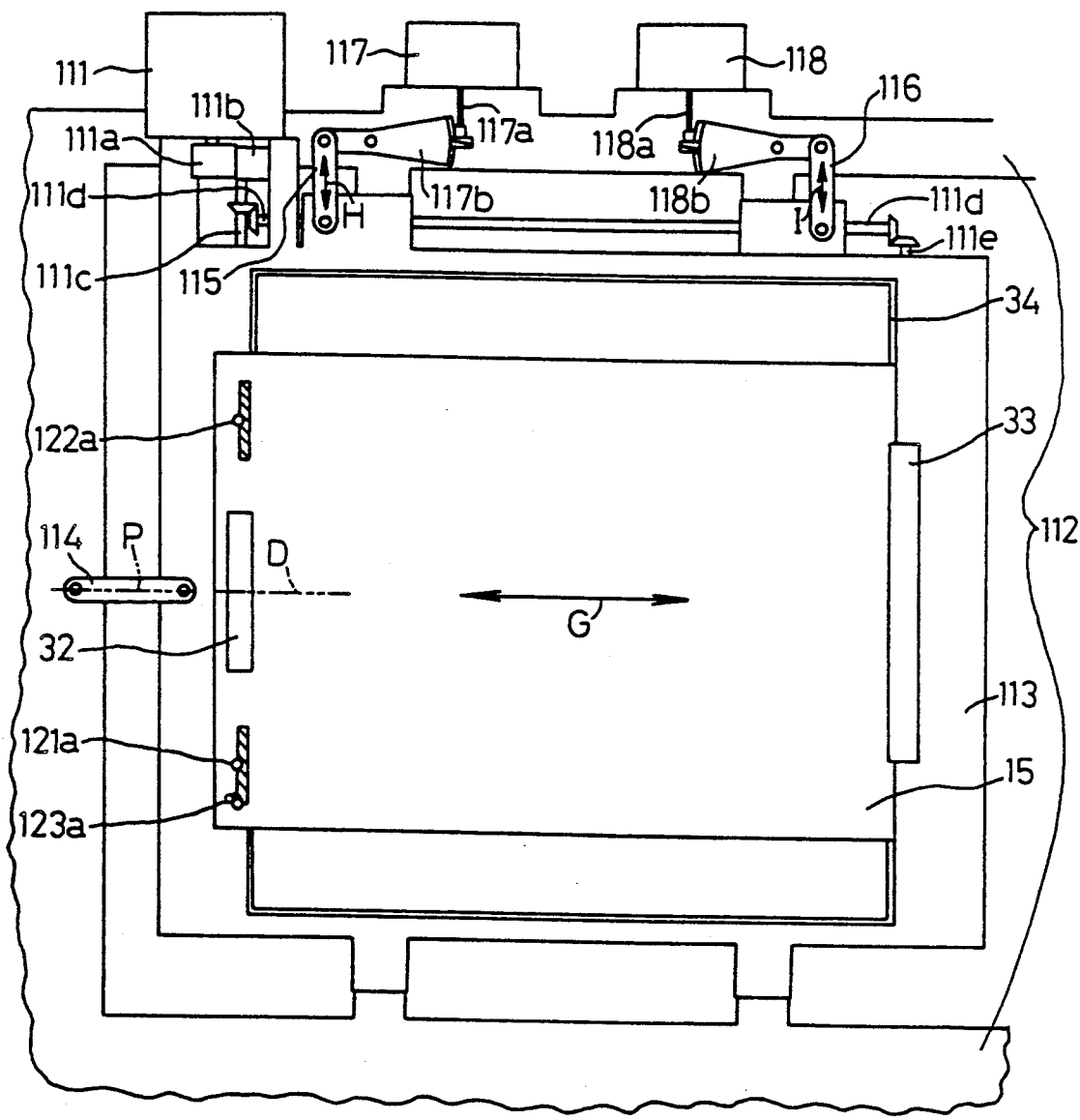
FIG. 3 is a plan view of the positioning means of FIG. 2.
Figure 4:
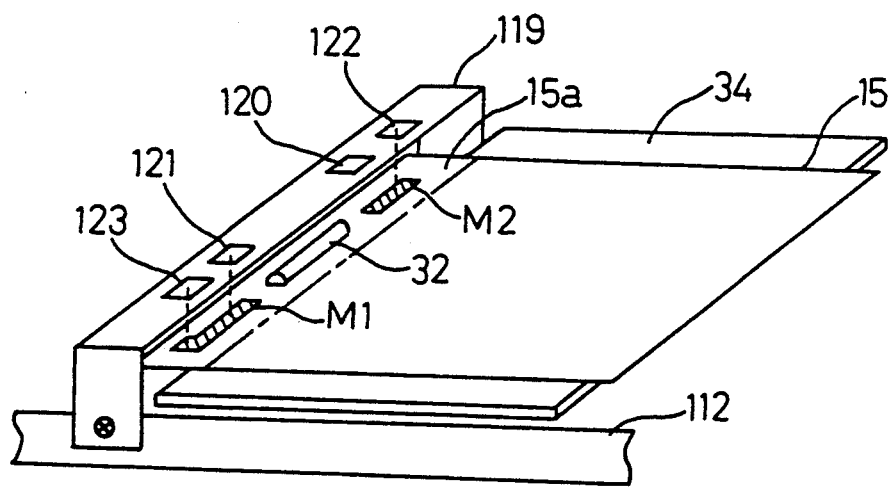
FIG. 4 is a perspective view of the positioning means of FIG. 2.
Figure 8:
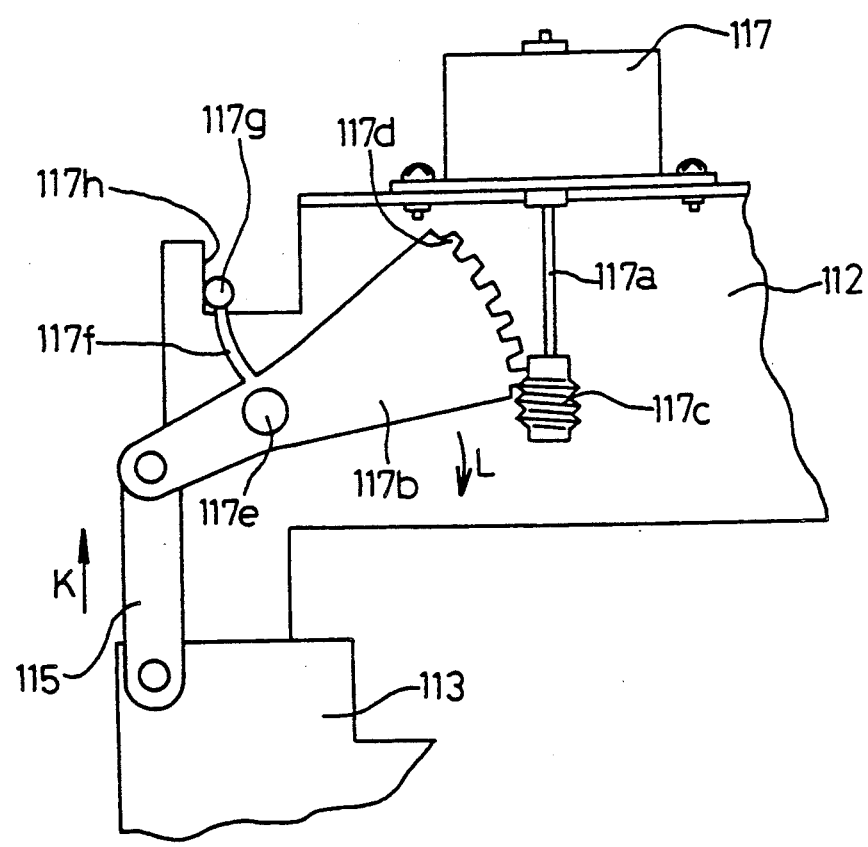
FIG. 8 is a plan view, similar to FIG. 7, explaining the operation of the positioning means of FIG. 2.
Figure 9:
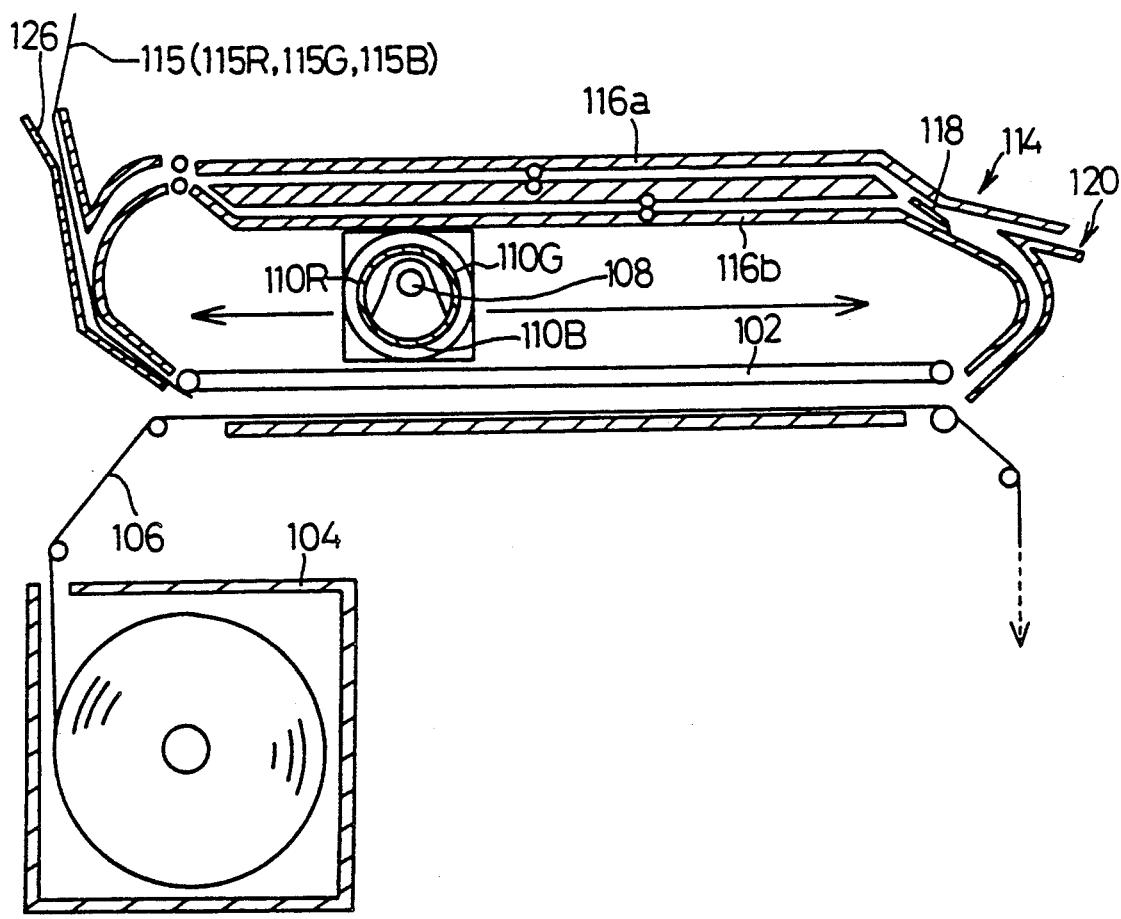
FIG. 9 is a schematic sectional view showing a mask transporting path of a conventional image forming apparatus.
Figure 10:
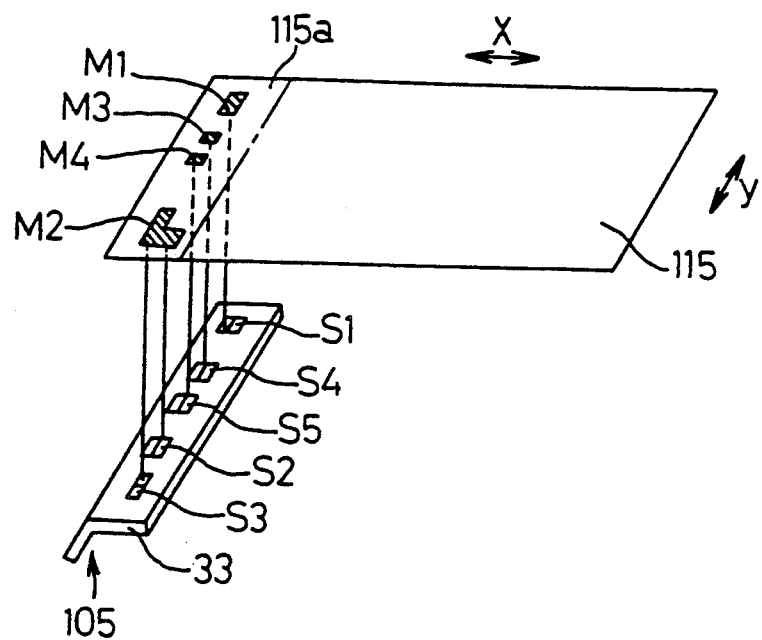
FIG. 10 is a perspective view showing a manner of positioning a mask.

FIG. 8 shows a mechanism interlocking the motor 117 and the positioning frame 113 of the positioning means 31 shown in FIG. 3. The motor 117 is fixed to the main frame 112. A worm gear 117c is mounted on the output shaft 117a of the motor 117 and engages a sector gear 117d formed in one end of a swing lever 117b pivotally supported for swing motion on a shaft 117e fixed to the main frame 112. One end of the link 115 is joined pivotally to the other end of the swing lever 117b, and the other end of the link 115 is joined pivotally to the positioning frame 113. A plate spring 117f projects from the swing lever 117b radially to the center of swing motion.

The tip 117g of the plate spring 117f engages a recess 117h formed in the main frame 112. The length of a portion provided with the sector gear 117d of the swing lever 117b with respect to the directions indicated by the double-headed arrow H corresponds to the range of movement of the positioning frame 113 with respect to the directions indicated by the double-headed arrow H.

Operation for moving the positioning frame 113 in the direction of an arrow I to position the positioning frame 113 at a desired position will be described. The motor 117 is actuated to turn the swing lever 117b on the shaft 117e in the direction of the arrow J by the worm gear 117c engaging the sector gear 117d, whereby the positioning frame 113 linked with the swing lever 117b is moved in the direction of the arrows H and I. When the motor 117 is driven continuously, the sector gear 117d of the swing lever 117b is disengaged from the worm gear 117c as shown in FIG. 8.

Thus, the exertion of an excessive force on the sector gear 117d is prevented. If the swing lever 117b is turned beyond a predetermined range of swing motion, the tip 117g of the plate spring 117f engages the recess 117h. In this state, the plate spring 117f exerts a force on the swing lever 117b in a direction opposite to the direction of turning motion of the swing lever 117b. Therefore, the sector gear 117d of the swing lever 117b and the worm gear 117c engage readily when the output shaft 117a of the motor 117 is rotated in the reverse direction to turn the swing lever 117b in the opposite direction.

The rotating direction of the output shaft 117a of the motor 117 is reversed to move the link 115 in the direction of an arrow K (FIG. 8). Since the swing lever 17b is biased in the direction of an arrow L (FIG. 8) by the plate spring 117f, the sector gear 117d of the swing lever 117b is able to engage the worm gear 117c when the output shaft 117a of the motor 117 is rotated in the reverse direction to turn the swing lever 117b in the direction of the arrow L and, consequently, the link 115 is moved in the direction of the arrow K (FIG. 8).

In this embodiment, the positioning means having the movable positioning frame comprises the motors, the swing levers for transmitting the driving force of the motors to the positioning frame, the transmission mechanism for transmitting the driving force of the motors to the swing levers, the spring plates each projecting from the corresponding swing lever radially to the center of swing motion of the corresponding swing lever, and recesses each for limiting the turning motion of the corresponding spring plate. Accordingly, the swing levers and the transmission mechanism are not subjected to an excessive force, and the durability of the positioning means is improved.

Many changes and modifications can be made to the embodiments of the present invention as described without departing from the spirit and scope of the invention as set forth herein.

As apparent from the foregoing description, according to the present invention, a mask member can be held or stored without forming a looped path for retaining the mask member. Consequently, the probability of a jam occurring is reduced and, should a jam occur, the jam can be readily corrected, thereby providing an additional advantage that a plurality of images can be formed at a high speed from a single set of mask members.

As is apparent from the foregoing description, the image forming apparatus in accordance with the present invention operates the positioning means selectively in the first operating mode, in which the mask member is removed from the positioning means after returning the positioning means to the initial position, or in the second operating mode, in which the mask member is removed from the positioning means before the positioning means begins to return to the initial position, namely, without moving the positioning means away from the position where the mask member has correctly been positioned. Thus, the tilt and dislocation of the mask in the mask transporting path is eliminated, and reduction of the image forming speed is increased.

While the invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image forming apparatus to form an image on a photosensitive recording medium by sequentially exposing the medium to light using each of plural mask members to form a component part of the image, each of said mask members to be selectively positioned in a exposure position on the photosensitive recording medium, said image forming apparatus comprising:

supporting means for supporting said mask members, said supporting means being transported from an initial position to a different position including said exposure position;

moving means for moving said supporting means to position each said mask member in the exposure position while said supporting means is being transported from said initial position to said different position including said exposure position;

exposure means for exposing the photosensitive recording medium to light through the mask member positioned in said exposure position;

returning means for returning said supporting means from the exposure position to said initial position after exposure has been completed by said exposure means;

discharging means for discharging the mask member from the exposure position to a discharging positron after exposure has been completed by said exposure means; and controlling means for controlling said discharging means and said returning means so that the mask member is discharged from said exposure positron to said discharging positron before said supporting means begins to return to its initial position by said returning means.

2. The image forming apparatus as defined in claim 1, wherein said moving means moves said supporting means along a direction perpendicular to a feeding direction of the mask member.

3. An image forming apparatus to form an image on a photosensitive recording medium by sequentially exposing light using each of plural mask members to form a component part of the image, each of said mask members to be selectively positioned in an exposure position on the photosensitive recording medium, said image forming apparatus comprising:

supporting means for supporting said mask members, said supporting means being transported from an initial position to a different position including said exposure position;

moving means for moving said supporting means to position each said mask member in the exposure position while said supporting means is being transported from said initial position to said different position including said exposure position;

exposure means for exposing the photosensitive recording medium to light through the mask member positioned in said exposure position;

returning means for returning said supporting means from the exposure position to said initial position after exposure has been completed by said exposure means;

discharging means for discharging the mask member from the exposure position to a discharging position after exposure has been completed by said exposure means; and controlling means having a first controlling mode of operation which controls said discharging means and said returning means so that the mask member is discharged from said exposure position to said discharging position before said supporting means begins to return to its initial position by said returning means and a second controlling mode of operation which controls said discharging means and said returning means so that the mask member is discharged from said exposure position to said discharging position while said supporting means is returned to the initial position by said returning means.

4. The image forming apparatus as defined in claim 3, wherein said moving means includes a motor having an output shaft, a worm gear being mounted on the output shaft, said worm gear engaging a sector gear when said supporting means is moved to position said mask member.

5. The image forming apparatus as defined in claim 4, wherein said sector gear is disengaged from said worm gear when said supporting means is in said exposure position.

6. An image forming apparatus to form an image on a photosensitive recording medium by sequentially exposing light using each of plural mask members to form a component part of the image, each of said mask members to be selectively positioned in an exposure position on the photosensitive recording medium, said image forming apparatus comprising:

supporting means for supporting said mask members, said supporting means being transported from an initial position to a different position including said exposure position;

moving means for moving said supporting means to position each said mask member in the exposure position while said supporting means is being transported from said initial position to said different position including said exposure position;

exposure means for exposing the photosensitive recording medium to light through the mask member positioned in said exposure position;

returning means for returning said supporting means from the exposure position to said initial position after exposure has been completed by said exposure means;

discharging means for discharging the mask member from the exposure position to a discharging position after exposure has been completed by said exposure means; and controlling means having a first controlling mode of operation which controls movement of the mask member so that the mask member moves one way in comparison with movement of said supporting means and a second controlling mode of operation which controls movement of the mask member so that the mask member moves a different way in comparison with movement of said supporting means.

7. The image forming apparatus as defined in claim 6, wherein said moving means includes a motor having an output shaft, a worm gear being mounted on the output shaft, said worm gear engaging a sector gear when said supporting means is moved to position said mask member.

8. The image forming apparatus as defined in claim 7, wherein said sector gear is disengaged from said worm gear when said supporting means is in said exposure position.

* * * * *